US009389273B2

(12) United States Patent
Gokmen et al.

(10) Patent No.: US 9,389,273 B2
(45) Date of Patent: Jul. 12, 2016

(54) SOLAR CELL CHARACTERISTICS DETERMINATION

(71) Applicant: International Business Machines Corporation, Armonk, NY (US)

(72) Inventors: Tayfun Gokmen, Briarcliff, NY (US); Oki Gunawan, Fair Lawn, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 855 days.

(21) Appl. No.: 13/675,928

(22) Filed: Nov. 13, 2012

(65) Prior Publication Data

US 2014/0136129 A1 May 15, 2014

(51) Int. Cl.
G01B 7/02 (2006.01)
G01R 31/26 (2014.01)
H02S 50/10 (2014.01)
H01L 31/0687 (2012.01)

(52) U.S. Cl.
CPC ............ *G01R 31/2605* (2013.01); *H02S 50/10* (2014.12); *H01L 31/0687* (2013.01); *Y02E 10/50* (2013.01); *Y02E 10/544* (2013.01)

(58) Field of Classification Search
USPC .......................................................... 702/65
See application file for complete search history.

(56) References Cited

U.S. PATENT DOCUMENTS

| 4,393,348 | A | 7/1983 | Goldstein et al. | |
|---|---|---|---|---|
| 4,454,472 | A | 6/1984 | Moore | |
| 5,177,351 | A * | 1/1993 | Lagowski | 250/215 |
| 5,663,657 | A | 9/1997 | Lagowski et al. | |
| 6,346,821 | B1 | 2/2002 | Baumgart | |
| 6,512,384 | B1 | 1/2003 | Lagowski et al. | |
| 7,521,954 | B2 | 4/2009 | Orschel et al. | |
| 8,766,087 | B2 | 7/2014 | Jones-Albertus et al. | |
| 2003/0047752 | A1 | 3/2003 | Campbell et al. | |
| 2009/0014061 | A1 | 1/2009 | Harris, Jr. et al. | |
| 2010/0044676 | A1 | 2/2010 | Sargent et al. | |
| 2010/0231121 | A1* | 9/2010 | Kaneda et al. | 313/503 |
| 2011/0303268 | A1 | 12/2011 | Tan et al. | |
| 2012/0010854 | A1 | 1/2012 | Ciocan et al. | |
| 2013/0263918 | A1 | 10/2013 | Konstantatos et al. | |
| 2013/0269764 | A1 | 10/2013 | Barkhouse et al. | |

OTHER PUBLICATIONS

R. Klenk et al., Photocurrent collection in thin film solar cells calculation and characterization for CuGaSe2/(Zn,Cd)S, Proceedings of the 12th European Photovoltaic Solar Energy Conference, 1994, pp. 1588-1591.

X. X. Liu et al., Solar-cell collection efficiency and its variation with voltage, Journal of Applied Physics, vol. 75, Issue 1, Jan 1994, pp. 577-581.

(Continued)

*Primary Examiner* — Paul D Lee
(74) *Attorney, Agent, or Firm* — Cantor Colburn LLP; Vazken Alexanian

(57) ABSTRACT

An apparatus for determining solar cell characteristics includes a quantum efficiency measurement tool configured to measure an external quantum efficiency of the solar cell and a reflectivity measurement tool configured to measure the reflectivity of the solar cell. The apparatus also includes a capacitance measurement tool configured to measure the capacitance of the solar cell and a processor configured to calculate a diffusion length of the solar cell based on the measured quantum efficiency, reflectivity and capacitance of the solar cell.

8 Claims, 6 Drawing Sheets

(56) References Cited

OTHER PUBLICATIONS

N. D. Arora et al., Diffusion length determination in p-n junction diodes and solar cells, Applied Physics Letters, vol. 37, No. 3, Aug. 1980, pp. 325-327.

G. Brown et al., Determination of the minority carrier diffusion length in compositionally graded Cu(In,Ga)Se2 solar cells using electron beam induced current, Applied Physics Letters, vol. 96, Issue 2, Jan. 2010, 022104, 3 pages.

M. A. Green, "Solar Cells: Operating Principles Technology," University of New South Wales Publishing, Chapter 8, pp. 138-145 Only, 1986.

M. Gloeckler, "Device physics of Cu(In,Ga)Se2 thin-film solar cells," Ph.D. thesis, Dissertation, Colorado State University, Fort Collins, Summer 2005, pp. 1-158.

T. Gokmen, et al., "Minority Carrier Diffusion Length Extraction in Cu2ZnSn(Se,S)4 Solar Cells," J. Appl. Phys., 114, 114511, Sep. 2013, pp. 1-7.

* cited by examiner

SOLAR CELL CHARACTERISTICS DETERMINATION

BACKGROUND

The disclosure relates generally to determining characteristics of solar cells, and in particular to determining a diffusion length and absorption coefficients of a thin-film solar cell.

Thin film solar cells, such as cadmium telluride (CdTe), Cu(In,Ga)Se$_2$ (CIGS) and Cu$_2$ZnSn(S,Se)$_4$ (CZTSSe) solar cells are growing solar cell technologies compared to the dominant silicon solar cell technology due to their thin material requirements and large scale manufacturability. In thin film solar cells, an absorber layer is embedded within one or more buffer layers and anti-reflective layers and is sandwiched between conductive contacts.

Minority carrier diffusion length ($L_d$) is a fundamental device characteristics in solar cells, especially thin film solar cells, that directly impacts the device performance. Diffusion length describes how long photo-generated minority carriers can travel before they recombine. Diffusion length needs to be maximized in all solar cells to maximize the efficiency of the solar cells. Long $L_d$ in high performance solar cells like silicon (with indirect band gap) can be measured using surface photovoltage techniques. However for devices with short diffusion lengths like thin film solar cells (with direct band gap) there are no known easy techniques for measuring diffusion length. In addition, there are no known easy techniques for measuring an absorption coefficient ($\alpha$) of an absorber layer of a thin-film solar cell, because measuring the diffusion length and absorption coefficient requires isolating characteristics of the embedded thin-film layer.

SUMMARY

According to one embodiment, an apparatus for determining solar cell characteristics includes a quantum efficiency measurement tool configured to measure an external quantum efficiency of the solar cell and a reflectivity measurement tool configured to measure the reflectivity of the solar cell. The apparatus also includes a capacitance measurement tool configured to measure the capacitance of the solar cell and a processor configured to calculate a diffusion length of the solar cell based on the measured quantum efficiency, reflectivity and capacitance of the solar cell.

According to one embodiment, a method of determining characteristics of a solar cell includes measuring an external quantum efficiency of the solar cell, measuring a reflectivity of the solar cell, and measuring a capacitance of the solar cell. The method also includes calculating a diffusion length of the solar cell based on the measured external quantum efficiency, the measured reflectivity and the measured capacitance of the solar cell.

According to one embodiment a computer program product includes a tangible computer readable storage medium having stored therein a computer program including computer code which, when executed by a processor, controls a computer including the processor to perform a method. The method includes measuring an external quantum efficiency of the solar cell, measuring a reflectivity of the solar cell, and measuring a capacitance of the solar cell. The method also includes calculating a diffusion length of the solar cell based on the measured external quantum efficiency, the measured reflectivity and the measured capacitance of the solar cell.

Additional features and advantages are realized through the techniques of the present disclosure. Other embodiments and aspects of the disclosure are described in detail. For a better understanding of embodiments of the disclosure, refer to the description and to the drawings.

BRIEF DESCRIPTION OF THE SEVERAL VIEWS OF THE DRAWINGS

Features characterizing embodiments of the present disclosure are described in the specification and claims which follow. These features, and advantages of embodiments of the disclosure are apparent from the following detailed description taken in conjunction with the accompanying drawings in which:

DETAILED DESCRIPTION

Characteristics of conventional solar cell devices may be measured using surface photovoltage techniques. However, for devices with short diffusion lengths, like thin film solar cells, conventional methods cannot readily be used to measure diffusion length. Embodiments of the present invention relate to measuring the diffusion length of a thin-film solar cell by measuring external quantum efficiency, reflectivity and capacitance.

Figure 1:
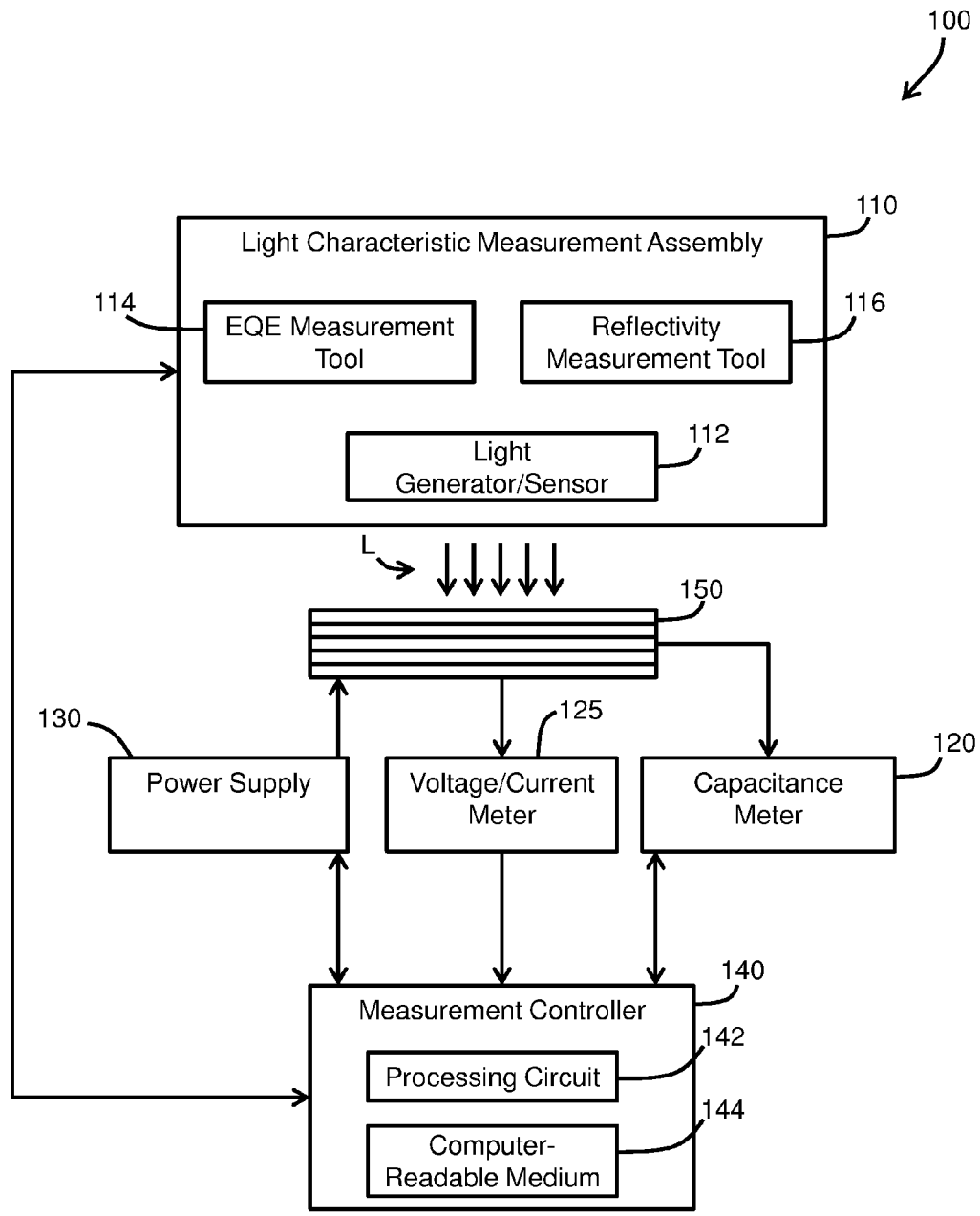
FIG. 1 illustrates a solar cell characteristic measurement system according to an embodiment of the invention.

FIG. 1 illustrates a system 100 for measuring solar cell characteristics according to one embodiment of the invention. The system 100 includes a light characteristic measurement assembly 110, a capacitance meter 120, a power supply 130 and a measurement controller 140. The system may also include a voltage and/or current meter 125.

The light characteristic measurement assembly 110 is configured to shine light on the solar cell 150 (indicated by arrows, L) and to detect characteristics of the solar cell 150 by analyzing the light reflected from the solar cell 150. The light characteristic measurement assembly 110 may include a light generator and sensors 112 to transmit light at multiple predetermined wavelengths and to detect the reflected light from the solar cell 150. The light characteristic measurement assembly 110 may also include an external quantum efficiency (EQE) measurement tool 114 and a reflectivity measurement tool 116. The EQE measurement tool 114 may measure the external quantum efficiency of the solar cell 150 based on an intensity of the light L applied to the solar cell 150 and a current, generated by the solar cell 150. For example, the EQE measurement tool 114 calculates the EQE based on the intensity of light at a certain wavelength, supplied to the solar cell 150 and the current detected by the current meter 125. The reflectivity measurement tool 116 may measure the intensity of the light L applied to the solar cell 150 and the intensity of light reflected from the solar cell 150. The EQE and reflectivity measurement tool and the current meter may employ light chopper and lock-in amplifier system to improve the signal-to-noise ratio and thus be able to detect very weak signals.

The capacitance meter 120 may measure a capacitance of the solar cell 150, or of a predetermined area of the solar cell 150 based on a voltage bias applied to the solar cell 150 by the power supply 130.

The measurement controller 140 may control operation of the light characteristic measurement assembly 110, capacitance meter 120 and power supply 130. For example, the measurement controller 140 may determine whether the EQE and reflectivity measurements have completed, and may control power supplied by the power supply 130 and operation of the capacitance meter 120 based on a determination that the EQE and reflectivity measurements have completed.

The measurement controller 140 may also include a processing circuit 142 for processing data output by the light characteristic measurement assembly 110 and the capacitance meter 120. For example, the processing circuit 142 may calculate an internal quantum efficiency (IQE) of the solar cell 150 based on the measured EQE and the measured reflectivity. In addition, the processing circuit 142 may calculate a depletion width ($x_d$) of the solar cell 150 based on the measured capacitance. In addition, the processing circuit 142 may calculate the diffusion length ($L_d$) of the solar cell 150 based on the calculated IQE and the calculated depletion width.

In one embodiment, the measurement controller 140 includes, or is connected to, a computer-readable medium 144. The computer-readable medium may store computer code to control operation of one or more of the measurement controller 140, the light characteristic measurement assembly 110, the capacitance meter 120, the voltage/current meter 125 and the power supply 130.

In embodiments of the invention, any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

In embodiments of the present invention, the solar cell 150 may be maintained in one position during all of the measurement processes. In other words, the solar cell 150 may be maintained in a position to receive the light from the light characteristic measurement assembly 110, to have a capacitance measured by the capacitance meter 120, to have a voltage bias supplied by the power supply 130 and to have a voltage or current output measured by the voltage/current meter 125. The measurement controller 140 may control the respective measurement devices to perform the measurements while the solar cell 150 is maintained the same position. For example, the solar cell 150 may be maintained in a dock, cradle mount or other holding apparatus.

In one embodiment, two or more of the light characteristic measurement assembly 110, the capacitance meter 120, the voltage/current meter 125, the power supply 130 and the measurement controller 140 are embodied in the same device. For example, in one embodiment all of the light characteristic measurement assembly 110, the capacitance meter 120 and the voltage/current meter 125 are part of one apparatus housed within a same housing that is in communication with the measurement controller 140. In another embodiment, the power supply 130 may also be part of the one apparatus including the light characteristic measurement assembly 110. In yet another embodiment, all of the light characteristic measurement assembly 110, the capacitance meter 120, the voltage/current meter 125, the power supply 130 and the measurement controller 140 are embodied in the same device. In one embodiment, the EQE measurement tool 114 and reflectivity measurement tool 116 comprise hardware and/or software that are part of the measurement controller 140, such as the processing circuit 142. In other embodiments, two or more of the EQE measurement tool 114, the reflectivity measurement tool 116, the capacitance meter 120, the voltage/current meter 125 and the measurement controller 140 may be separate devices electrically connected via data communications lines or via wireless communications.

In embodiments of the present invention, the solar cell 150 may be a thin-film solar cell, such as a $Cu(In,Ga)Se_2$ ("CIGS") solar cell, a $Cu_2ZnSn(S,Se)_4$ ("CZTSSe") solar cell or any other type of thin-film solar cell. The solar cell may comprise multiple layers, such as a an anti-reflective layer on a light-receiving side, an absorber layer including an n-type layer and a p-type layer to generate a charge based on receiving photons from light applied to the solar cell, one or more buffer layers and contact layers on opposing sides of the solar cell 150 to transmit the generated charge through a circuit.

Figure 2:
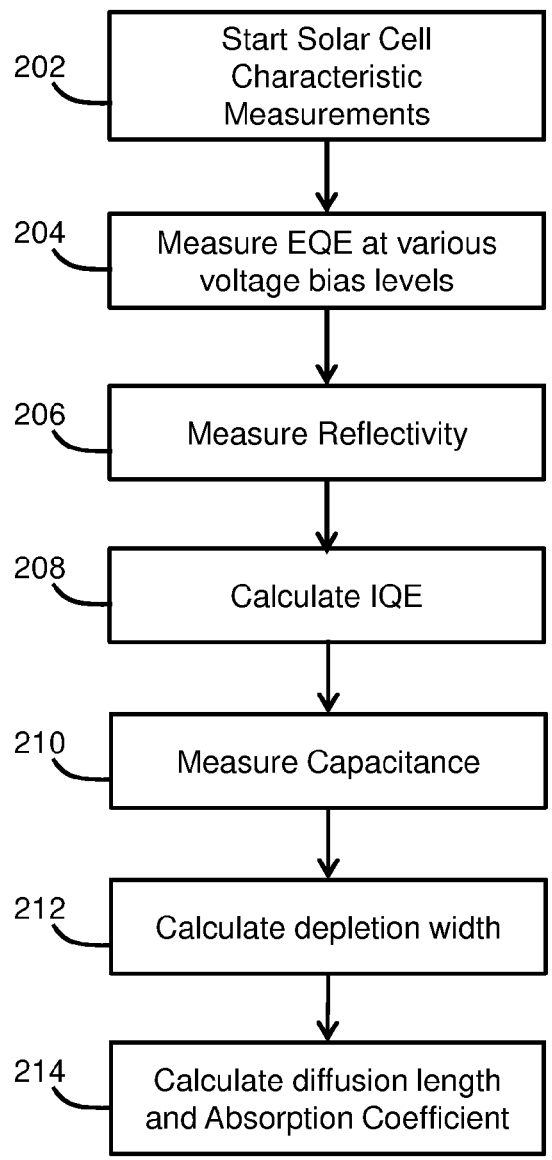
FIG. 2 is a flow chart illustrating a method for measuring solar cell characteristics according to one embodiment.

Operation of the system 100 for measuring solar cell characteristics will be described in further detail with reference to FIGS. 2-5. Referring to FIG. 2, in block 202 a determination is made that solar cell characteristic measurements should begin. For example, a command may be received from an external user, device or system to begin measurements, or a program stored in the measurement controller 140 may initiate measurements.

Figure 3:
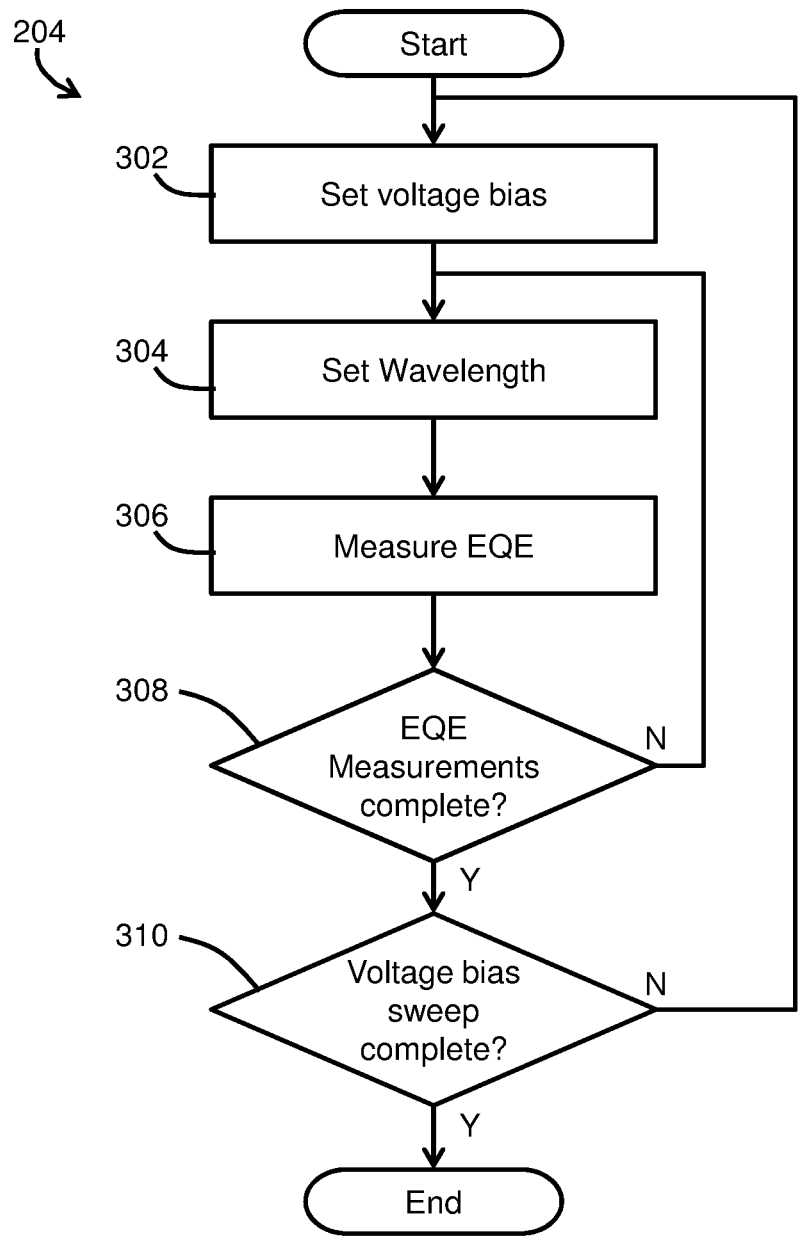
FIG. 3 is a flow chart illustrating measuring external quantum efficiency according to one embodiment.

In block 204, an external quantum efficiency (EQE) of the solar cell 150 is measured. FIG. 3 illustrates block 204 in further detail. In block 302, a voltage bias level is set. In one embodiment, a predetermined number of voltage bias levels, having predetermined values, are pre-designated or stored to be applied at each wavelength of a predetermine number of wavelengths having predetermined values. In block 304, a wavelength ($\lambda$) of the light L is set. For example, the EQE measurement tool 114 may control the light generator/sensor 112 to set the wavelength of the light L at a predetermined level. In block 306, the external quantum efficiency is measured at the set wavelength and voltage bias level. For example, an intensity of the light L at the set wavelength may be compared with an intensity output from the solar cell 150, such as a voltage or current detected by the voltage/current meter 125.

In block 308, it is determined whether the EQE measurements are complete. For example, one or both of the EQE measurement tool 114 and the measurement controller 140 may be configured to perform an extended EQE measurement process by repeating EQE measurements (EQE vs wavelength) at a predetermined number of different voltage bias levels (Vbias). If the EQE measurement process is not complete, then the next wavelength may be set in block 304 and the process repeats. If the EQE measurement process is complete, then it is determined in block 310 if the voltage bias sweep is complete 310, or in other words, if the EQE measurements have been performed at each voltage bias level of predetermined multiple voltage bias levels. If the voltage bias sweep is not complete, then a next voltage bias level is set in block 302 and the process of performing EQE measurements at various wavelengths repeats. If it is determined in block 310 that the voltage bias sweep is complete, the EQE measurement process ends, and the solar cell characteristic measurement process proceeds to block 206 in FIG. 2.

Figure 4:
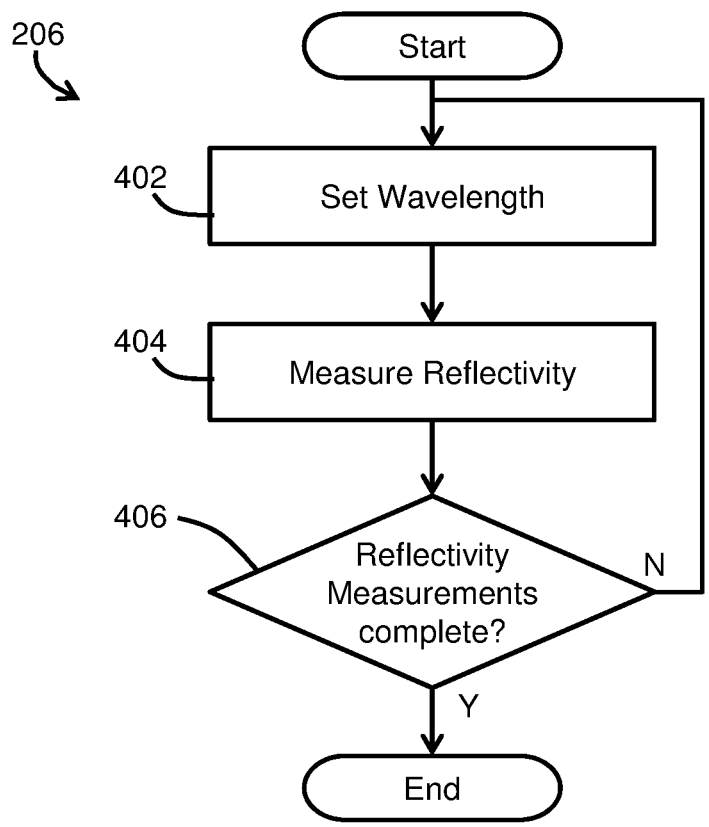
FIG. 4 is a flow chart illustrating measuring reflectivity according to one embodiment.

In block 206, a reflectivity of the solar cell 150 is measured. FIG. 4 illustrates block 206 in further detail. In block 402, a wavelength ($\lambda$) of the light L is set. For example, the reflectivity measurement tool 116 may control the light generator/sensor 112 to set the wavelength of the light L at a predetermined level. In block 404, the reflectivity is measured at the set wavelength. For example, an intensity of the light L applied to the solar cell 150 by the light generator/sensor 112 may be compared with an intensity of light reflected from the solar cell 150 and detected by the light generator/sensor 112.

In block 406, it is determined whether the reflectivity measurements are complete. For example, one or both of the reflectivity measurement tool 116 and the measurement controller 140 may be configured to perform an extended reflectivity measurement process by repeating reflectivity measurements at a predetermined number of different wavelengths. The wavelengths at which the reflectivity is measured may be the same wavelengths at which the EQE is measured. If the reflectivity measurement process is not complete, then the next wavelength may be set in block 402 and the process repeats. If the reflectivity measurement process is complete, then the reflectivity measurement process ends, and the solar cell characteristic measurement process proceeds to block 208 in FIG. 2.

In one embodiment, the EQE and reflectivity are measured simultaneously. For example, in one embodiment light L of a set wavelength is applied to the solar cell 150, then each of the EQE and reflectivity are measured based on the applied light. Then, light L of a next wavelength may be applied and the EQE and reflectivity may again be measured. In other words, blocks 204 and 206 of FIG. 2 may be performed simultaneously.

In block 208, an internal quantum efficiency (IQE) of the solar cell 150 is calculated based on the measured EQE and the measured reflectivity of the solar cell 150. The IQE may be calculated based on the following equation:

$$IQE(\lambda) = \frac{EQE}{1 - R} \quad (1)$$

In equation (1), EQE represents the measured external quantum efficiency and R represents the measured reflectivity. The IQE may be calculated for each wavelength ($\lambda$) at which the EQE and reflectivity were measured. In one embodiment, the IQE or multiple IQE values may be calculated by the measurement controller 140, such as by the processing circuit 142.

Figure 5:
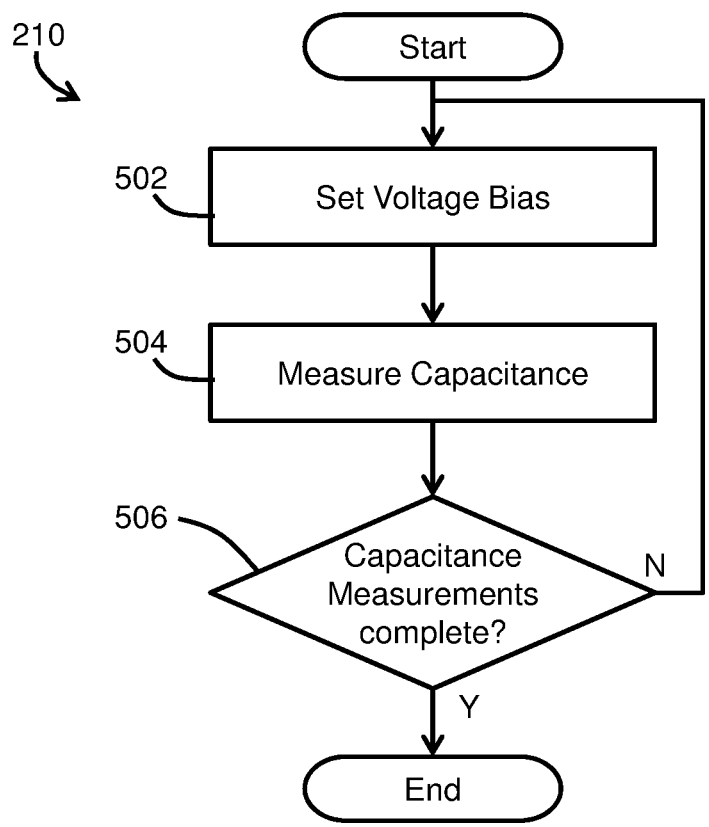
FIG. 5 is a flow chart illustrating measuring solar cell capacitance according to one embodiment.

In block 210, a capacitance of the solar cell 150 is measured. FIG. 5 illustrates block 210 in further detail. In block 502, a voltage bias applied to the solar cell 150 by the power supply 130 is set. For example, the measurement controller 140 may control the power supply 130 to set the voltage bias at a predetermined level. In block 504, the capacitance of the solar cell 150 is measured. For example, the capacitance meter 120 may be connected to opposing contacts of the solar cell 150 and may measure the capacitance of the solar cell 150 when the predetermined voltage bias is applied to the solar cell 150.

In block 506, it is determined whether the capacitance measurements are complete. For example, the measurement controller 140 may be configured to perform an extended capacitance measurement process by repeating capacitance measurements at a predetermined number of different voltage bias levels. If the capacitance measurement process is not complete, then the next voltage bias level may be set in block 502 and the process repeats. If the capacitance measurement process is complete, then the capacitance measurement process ends, and the solar cell characteristic measurement process proceeds to block 212 in FIG. 2.

In block 212, the depletion width $x_d$ of the solar cell, or more specifically, the depletion width of the space charge region of the absorber layer, is calculated based on the measured capacitance of the solar cell. The depletion width may be calculated based on the following formula:

$$xd = \in A/C \quad (2)$$

In formula (2), $\in$ represents the dielectric constant of the absorber layer, A represents an area of the device, and C represents the measured capacitance. The depletion width may be calculated for each voltage bias at which the capacitance was measured. In one embodiment, the depletion width, or multiple depletion width values, may be calculated by the measurement controller 140, such as by the processing circuit 142.

Figure 6:
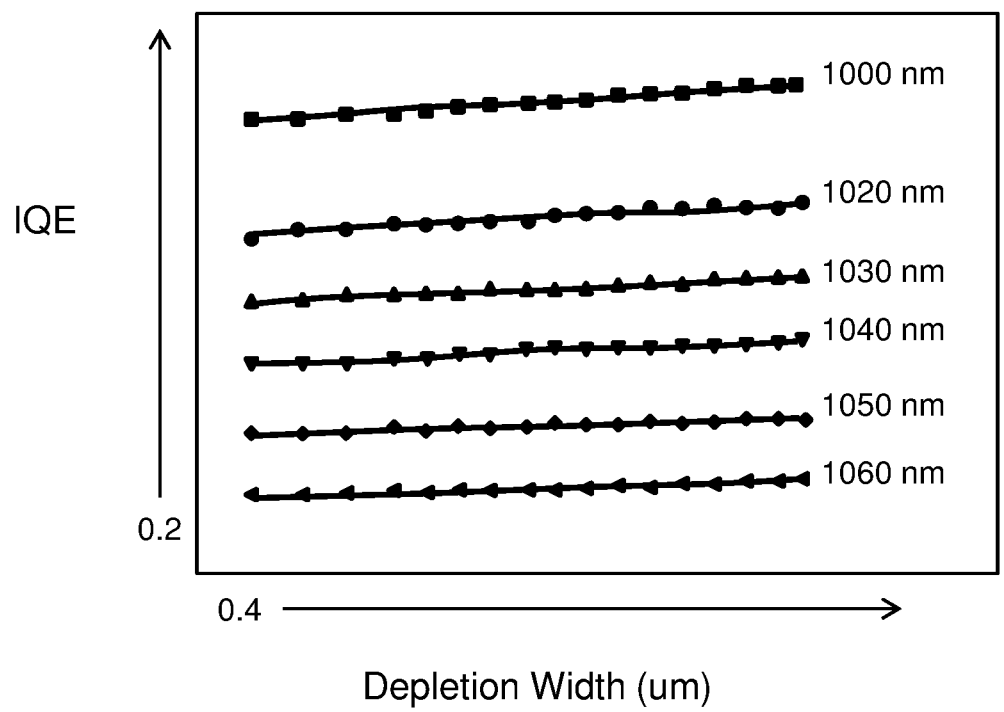
FIG. 6 is a graph of a plurality of calculated values based on measurements according to embodiments of the invention.

FIG. 6 illustrates a graph of a plurality of calculated IQE values versus the calculated depletion width values (which is a function of voltage bias). In FIG. 6, each curve corresponds to IQE measured and calculated at separate wavelength. In embodiments of the present invention, the data represented by FIG. 6 may be stored by the measurement controller 140, for example.

In block 214, the diffusion length of the solar cell and the absorption coefficient are calculated by curve-fitting the IQE data represented by FIG. 6. The data may be curve-fit using the following equation:

$$IQE[\alpha(\lambda), x_d(V), L_d] = 1 - \frac{1}{1 + \alpha(\lambda)L_d} \exp[-\alpha(\lambda)x_d(V)] \quad (3)$$

In equation 3, $\alpha$ represents an absorption coefficient, $L_d$ represents the diffusion length, $\lambda$ represents a wavelength, $x_d$ represents the depletion width, and V represents a voltage bias. In other words, the absorption coefficient is a function of wavelength and the depletion width is a function of voltage bias. Curve-fitting the IQE data set represented by FIG. 6 results in a single diffusion length value for the entire data set and absorption coefficient values of the absorber layer as a function of wavelength.

According to embodiments of the present disclosure, the diffusion length of thin-film solar cells may be calculated by measuring the external quantum efficiency, reflectivity and capacitance of the solar cell. In addition, the absorption coefficient of the absorber layer of the thin-film solar cell may be determined as a function of wavelength based on the measured external quantum efficiency, reflectivity and capacitance. In some embodiments, a solar cell may be connected to one device, apparatus or system that includes tools for measuring the external quantum efficiency, reflectivity and capacitance of the solar cell. The apparatus, device or system may maintain the solar cell in one position while switching between operation of the measurement devices to obtain multiple measurements of external quantum efficiency, reflectivity and capacitance.

As will be appreciated by one skilled in the art, aspects of the present disclosure may be embodied as an apparatus, system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system."Furthermore, aspects of the present disclosure may take the form of a computer program product embodied in one or more computer readable medium(s) having computer readable program code embodied thereon.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated Embodiments of the present invention encompass measuring characteristics of any type of solar cell, such as various different types of thin-film solar cells for which calculation of diffusion length and absorption coefficient may be difficult. Embodiments encompass a unitary device or multiple devices communicatively connected to each other via wires or wirelessly. Embodiments further encompass methods for obtaining the measurements and calculations and computer program products for controlling computers to perform the methods.

While a preferred embodiment of the invention has been described, it will be understood that those skilled in the art, both now and in the future, may make various improvements and enhancements which fall within the scope of the claims which follow.

What is claimed is:

1. An apparatus for determining solar cell characteristics, comprising:
   a light generator and sensor disposed to shine light on and detect light reflected from a solar cell;
   a current meter disposed to detect current applied to the solar cell;
   a power supply disposed to apply a bias voltage to the solar cell;
   a quantum efficiency measurement tool configured to measure an external quantum efficiency (EQE) of the solar cell based on an intensity of light shined onto the solar cell and the detected applied current;
   a reflectivity measurement tool configured to measure a reflectivity (R) of the solar cell based on an intensity of light shined onto and reflected from the solar cell;
   a capacitance measurement tool comprising a capacitance meter configured to measure the capacitance (C) of the solar cell based on the voltage bias; and
   a processor configured to:
   calculate an internal quantum efficiency (IQE) of the solar cell based on the measured external quantum efficiency and the measured reflectivity using the following equation:

$$IQE(\lambda) = \frac{EQE}{1-R},$$

wherein $\lambda$ represents a wavelength at which the EQE and reflectivity are measured,
   calculate a depletion width ($x_d$) of the solar cell using the measured capacitance using the following equation:

$$x_d = \in A/C,$$

wherein $\in$ represents a dielectric constant of an absorber layer of the solar cell and A represents an area of the solar cell,
   determine a diffusion length ($L_d$) of the solar cell based on the calculated IQE and the calculated depletion width of the solar cell by curve-fitting IQE data using the following equation:

$$IQE[\alpha(\lambda), x_d(V), L_d] = 1 - \frac{1}{1+\alpha(\lambda)L_d}\exp[-\alpha(\lambda)x_d(V)],$$

wherein $\alpha$ represents an absorption coefficient of the absorber layer of the solar cell and V represents a voltage bias applied to the solar cell.

2. The apparatus of claim 1, wherein the processor is configured to control the quantum efficiency measurement tool to measure a plurality of external quantum efficiency values as a function of wavelengths and as a function of voltage biases, and to measure a plurality of reflectivity values as a function of wavelengths, to control the capacitance measurement tool to measure a plurality of capacitance values of the solar cell as a function of a plurality of voltage bias levels, to calculate a plurality of internal quantum efficiency values based on the plurality of external quantum efficiency values and reflectivity values, to calculate a plurality of depletion width values of the solar cell based on the plurality of capacitance values, and to calculate the diffusion length of the solar cell based on the plurality of internal quantum efficiency values and the plurality of depletion width values.

3. The apparatus of claim 2, wherein the processor is further configured calculate the diffusion length of the solar cell by curve-fitting the plurality of internal quantum efficiency values and the plurality of depletion width values to calculate a single diffusion length value for the solar cell.

4. The apparatus of claim 2, wherein the processor is further configured to calculate an absorption coefficient value of an absorber layer of the solar cell as a function of wavelength by curve-fitting the plurality of internal quantum efficiency values and the plurality of depletion width values.

5. The apparatus of claim 1, wherein the apparatus is configured to maintain the solar cell in a same position and in connection with the EQE measurement tool, the reflectivity measurement tool, the light generator and sensor, the current meter, the power supply and the capacitance meter, and
   wherein the apparatus further comprises a measurement tool controller configured to switch between measurements of the external quantum efficiency and reflectivity and the capacitance of the solar cell.

6. A non-transitory computer program product, comprising:
   a tangible computer readable storage medium having stored therein a computer program including computer code which, when executed by a processor, controls a computer including the processor to perform a method, the method comprising:
   shining light on and detecting light reflected from the solar cell at a light generator and sensor, detecting current applied to the solar cell at a current meter and applying a bias voltage to the solar cell by a power supply;
   measuring an external quantum efficiency (EQE) of a solar cell based on an intensity of light shined onto the solar cell and the detected applied current using an EQE measurement tool;
   measuring a reflectivity (R) of the solar cell based on the intensity of light shined onto and an intensity of light reflected from the solar cell using a reflectivity measurement tool;
   measuring a capacitance (C) of the solar cell based on the voltage bias using a capacitance meter; and
   calculating an internal quantum efficiency (IQE) of the solar cell based on the measured external quantum efficiency and the measured reflectivity using the following equation:

$$IQE(\lambda) = \frac{EQE}{1-R},$$

wherein $\lambda$ represents a wavelength at which the EQE and reflectivity are measured;
   calculating a depletion width ($x_d$) of the solar cell using the measured capacitance using the following equation:

$$x_d = \in A/C,$$

wherein $\in$ represents a dielectric constant of an absorber layer of the solar cell, and A represents an area of the solar cell; and determining a diffusion length ($L_d$) of the solar cell based on the calculated IQE and the calculated depletion width of the solar cell by curve-fitting IQE data using the following equation:

$$IQE[\alpha(\lambda), x_d(V), L_d] = 1 - \frac{1}{1+\alpha(\lambda)L_d}\exp[-\alpha(\lambda)x_d(V)],$$

wherein $\alpha$ represents an absorption coefficient of the absorber layer of the solar cell and V represents a voltage bias applied to the solar cell.

7. The computer program product of claim 6, wherein measuring the external quantum efficiency of the solar cell includes obtaining a plurality of external quantum efficiency values of the solar cell as a function of a respective plurality of wavelengths, measuring the reflectivity includes obtaining a plurality of reflectivity values of the solar cell as a function of the respective plurality of wavelengths, and measuring the capacitance of the solar cell includes obtaining a plurality of capacitance values as a function of a plurality of voltage bias levels, the method further comprising:

calculating a plurality of internal quantum efficiency values of the solar cell based on the plurality of external quantum efficiency values and reflectivity values;

calculating a plurality of depletion width values of the solar cell based on the plurality of capacitance values; and calculating the diffusion length of the solar cell based on the plurality of internal quantum efficiency values and the plurality of depletion width values.

8. The computer program product of claim 7, wherein calculating the diffusion length of the solar cell comprises curve-fitting the plurality of internal quantum efficiency values and the plurality of depletion width values to calculate a single diffusion length value for the solar cell.

\* \* \* \* \*